(12) United States Patent
Kinoshita (10) Patent No.: US 7,550,919 B2
(45) Date of Patent: Jun. 23, 2009

(54) ORGANIC ELECTROLUMINESCENT DEVICE WITH REDUCED INITIAL DRIVE VOLTAGE AND MANUFACTURING METHOD THEREOF

(75) Inventor: Toshihiro Kinoshita, Katano (JP)

(73) Assignee: Sanyo Electric Co., Ltd., Osaka (JP)

(*) Notice: Subject to any disclaimer, the term of this patent is extended or adjusted under 35 U.S.C. 154(b) by 0 days.

(21) Appl. No.: 10/809,916

(22) Filed: Mar. 26, 2004

(65) Prior Publication Data

US 2005/0062406 A1  Mar. 24, 2005

(30) Foreign Application Priority Data

Mar. 28, 2003  (JP) .............................. 2003-090614

(51) Int. Cl.
  *H01J 1/62* (2006.01)
  *H01J 63/04* (2006.01)
(52) U.S. Cl. ..................... 313/506; 313/498; 313/504
(58) Field of Classification Search ......... 313/502–504, 313/506, 498, 512
  See application file for complete search history.

(56) References Cited

U.S. PATENT DOCUMENTS

| | | | | |
|---|---|---|---|---|
| 4,759,993 A * | 7/1988 | Pai et al. ..................... | 428/450 |
| 5,116,640 A * | 5/1992 | Mikami et al. ............... | 427/569 |
| 5,294,870 A | 3/1994 | Tang et al. | |
| 6,127,004 A | 10/2000 | Hatwar et al. | |
| 6,208,077 B1 * | 3/2001 | Hung ......................... | 313/506 |
| 6,211,065 B1 * | 4/2001 | Xi et al. ...................... | 438/627 |
| 6,280,861 B1 * | 8/2001 | Hosokawa et al. ........... | 428/690 |
| 6,420,057 B1 | 7/2002 | Ueda et al. | |
| 6,515,314 B1 | 2/2003 | Duggal et al. | |
| 6,558,820 B2 | 5/2003 | Raychaudhuri et al. | |
| 6,579,629 B1 | 6/2003 | Raychaudhuri et al. | |
| 6,875,320 B2 | 4/2005 | Raychaudhuri et al. | |

(Continued)

FOREIGN PATENT DOCUMENTS

JP  06-314594  11/1994

(Continued)

OTHER PUBLICATIONS

Yu, Wang-Lin et al., Hole-injection enhancement by copper phthalocyanine (CuPc) in blue polymer light-emitting diodes, Feb. 15, 2001, Journal of Applied Physics, vol. 89, No. 4, pp. 2343-2350.*

(Continued)

*Primary Examiner*—Edward J Glick
*Assistant Examiner*—Anastasia Midkiff
(74) *Attorney, Agent, or Firm*—McDermott Will & Emery LLP (57) ABSTRACT

In an organic EL device, a hole injection electrode (anode) made of a transparent electrode. A first hole injection layer made of CuPc, a second hole injection layer made of CFx, a hole transport layer and a light emitting layer each made of an organic material are formed in this order on the hole injection electrode. An electron injection electrode (cathode) is further formed on the light emitting layer. The first hole injection layer made of CuPc absorbs ultraviolet light, so that the organic EL device can be prevented from deterioration by the ultraviolet light. The second hole injection layer made of CFx promotes injection of holes, so that the initial drive voltage can be reduced.

7 Claims, 6 Drawing Sheets

U.S. PATENT DOCUMENTS

| | | | |
|---|---|---|---|
| 6,936,962 B2 * | 8/2005 | Hamada et al. | 313/506 |
| 7,002,293 B2 | 2/2006 | Madathil et al. | |
| 7,057,338 B2 | 6/2006 | Hamada et al. | |
| 7,086,918 B2 * | 8/2006 | Hsiao et al. | 445/24 |
| 7,098,474 B2 | 8/2006 | Kanno et al. | |
| 2002/0113241 A1 * | 8/2002 | Kubota et al. | 257/79 |
| 2002/0117962 A1 | 8/2002 | Beierlein et al. | |
| 2002/0121860 A1 | 9/2002 | Seo et al. | |
| 2002/0153831 A1 * | 10/2002 | Sakakura et al. | 313/504 |
| 2003/0035978 A1 | 2/2003 | Raychaudhuri et al. | |
| 2003/0168972 A1 | 9/2003 | Hamada et al. | |
| 2003/0232215 A1 * | 12/2003 | Richter et al. | 428/690 |
| 2004/0142206 A1 * | 7/2004 | Bazan et al. | 428/690 |
| 2006/0028129 A1 | 2/2006 | Sakakibara et al. | |

FOREIGN PATENT DOCUMENTS

| | | |
|---|---|---|
| JP | 10-233288 | 9/1998 |
| JP | 2000-068070 | 3/2000 |
| JP | 2000-150170 | 5/2000 |
| JP | 2000-150171 | 5/2000 |
| JP | 2001-076884 | 3/2001 |
| JP | 2002-075658 | 3/2002 |
| JP | 2002-231457 | 8/2002 |
| JP | 2002-324680 | 11/2002 |
| JP | 2002-343573 | 11/2002 |
| JP | 2003-243155 | 8/2003 |
| JP | 2003-257664 | 9/2003 |
| JP | 2003-257673 | 9/2003 |
| JP | 2004-119303 | 4/2004 |

OTHER PUBLICATIONS

"Exciplex formation at the organic solid/solid interface and turning of the emission color in organic electroluminescent devices", K. Okumoto, Y. Shirota, Journal of Luminescence 87-89 (2000) 1171-1173.

"Surface and Interface Analysis of Organic Electroluminescent Devices", A. Murase, et al., R&D Review of Toyota CRDL., vol. 37, No. 4, pp. 45-52.

* cited by examiner

ORGANIC ELECTROLUMINESCENT DEVICE WITH REDUCED INITIAL DRIVE VOLTAGE AND MANUFACTURING METHOD THEREOF

BACKGROUND OF THE INVENTION

1. Field of the Invention

The present invention relates to an organic electroluminescent device and manufacturing method thereof.

2. Description of the Background Art

The organic electroluminescent device (hereinafter referred to as "organic EL device") is expected as a new type self light emitting device. The organic EL device has a layered structure including a carrier transport layer (electron or hole transport layer) between a hole injection electrode and an electron injection electrode, and a light emitting layer.

An electrode material having a large work function such as gold or ITO (Indium-Tin Oxide) is used for the hole injection electrode, while an electrode material having a small work function such as Mg (magnesium) or Li (lithium) is used for the electron injection electrode.

An organic material is used for the hole transport layer, the light emitting layer and the electron transport layer. A material having the characteristic of p-type semiconductor is used for the hole transport layer, while a material having the characteristic of n-type semiconductor is used for the electron transport layer. The light emitting layer also has carrier transport capability such as electron or hole transport capability, and is made of an organic material emitting fluorescent light or phosphorescent light.

Note that depending upon organic materials to be used, these functional layers such as the hole transport layer, electron transport layer and light emitting layer may each include a plurality of layers or some of them may not be provided at all.

In order to improve operating stability of the organic EL device, insertion of a CuPc (copper phthalocyanine) layer between a hole injection electrode and a hole transport layer has been proposed. However, the insertion of the CuPc layer between the hole injection electrode and hole transport layer has a disadvantage of increasing the initial drive voltage (refer to, for instance, JP-2000-150171-A).

In addition, the organic EL device may be deteriorated when exposed to external ultraviolet irradiation, depending upon the materials. This phenomenon will, hereinafter, be called "light deterioration". The light deterioration lowers the luminance of an organic EL device. For this reason, it is necessary to increase the drive voltage with time in order to keep the luminance of the organic EL device constant.

SUMMARY OF THE INVENTION

It is an object of the present invention to provide an organic electroluminescent device which can be prevented from the light deterioration and provide reduced initial drive voltage, and a manufacturing method thereof.

An organic electroluminescent device according to one aspect of the present invention comprises a hole injection electrode; a hole injection layer; a light emitting layer; and an electron injection electrode in this order, the hole injection layer including a first hole injection layer and a second hole injection layer, the first hole injection layer having a property of absorbing ultraviolet light, the second hole injection layer having a property of promoting injection of holes.

In the organic electroluminescent device, the first hole injection layer absorbs ultraviolet light, while the second hole injection layer promotes the injection of holes. Consequently, the organic electroluminescent device can be prevented from deterioration by ultraviolet light while having reduced initial drive voltage. Furthermore, it is unnecessary to increase the drive voltage with time in order to maintain the luminance.

The first hole injection layer preferably absorbs not less than 10% of ultraviolet light having a wavelength shorter than 380 nm. In this case, ultraviolet light is reliably absorbed by the first hole injection layer. As a result, the organic electroluminescent device can be prevented from deterioration.

The first hole injection layer may be made of at least one kind of compound selected from the group consisting of a phthalocyanine-based compound, porphyrin compound, amine-based compound, polyaniline-based compound, polythiophene-based compound, and polypyrrole-based compound. This allows absorption of ultraviolet light.

The second hole injection layer may be made of at least one kind of compound selected from the group consisting of a crystalline or non-crystalline inorganic material, phthalocyanine-based compound, porphyrin compound, amine-based compound, polyaniline-based compound, polythiophene-based compound, and polypyrrole-based compound. The second hole injection layer may alternatively be made of a material selected from the group consisting of a carbon-based material, silicon-based material, silicon carbide-based material, and cadmium sulfide-based material. Moreover, the second hole injection layer may be made of a halide. Furthermore, the second hole injection layer may be made of a carbon-based halide. In particular, the second hole injection layer may be made of fluorocarbon. This allows sufficiently reduced initial drive voltage.

The first hole injection layer may be made of copper phthalocyanine. In this case, the first hole injection layer can effectively absorb ultraviolet light.

Preferably, the first hole injection layer has a thickness not smaller than 5 nm. Preferably, the first hole injection layer has a thickness not larger than 15 nm. This prevents the deterioration of the organic electroluminescent device by ultraviolet light.

Preferably, the second hole injection layer has a thickness not smaller than 0.5 nm. Preferably, the second hole injection layer has a thickness not larger than 3 nm. This allows reduced initial drive voltage.

A method of manufacturing an organic electroluminescent device according to another aspect of the present invention comprises the steps of forming a hole injection layer on a hole injection electrode; and forming a light emitting layer and an electron injection electrode in this order above the hole injection layer, the step of forming the hole injection layer including the steps of forming a first hole injection layer having a property of absorbing ultraviolet light; and forming a second hole injection layer having a property of promoting injection of holes.

In the method of manufacturing the organic electroluminescent device, the hole injection layer is formed on the hole injection electrode, and the light emitting layer and the electron injection electrode are formed in this order on the hole injection layer. The hole injection layer includes the first hole injection layer having a property of absorbing ultraviolet light and the second hole injection layer having a property of promoting the injection of holes. Consequently, the organic electroluminescent device can be prevented from deterioration by ultraviolet light while having reduced initial drive voltage. Furthermore, it is unnecessary to increase the drive voltage with time in order to maintain the luminance.

The foregoing and other objects, features, aspects and advantages of the present invention will become more appar-

DESCRIPTION OF THE PREFERRED EMBODIMENTS

Figure 1:
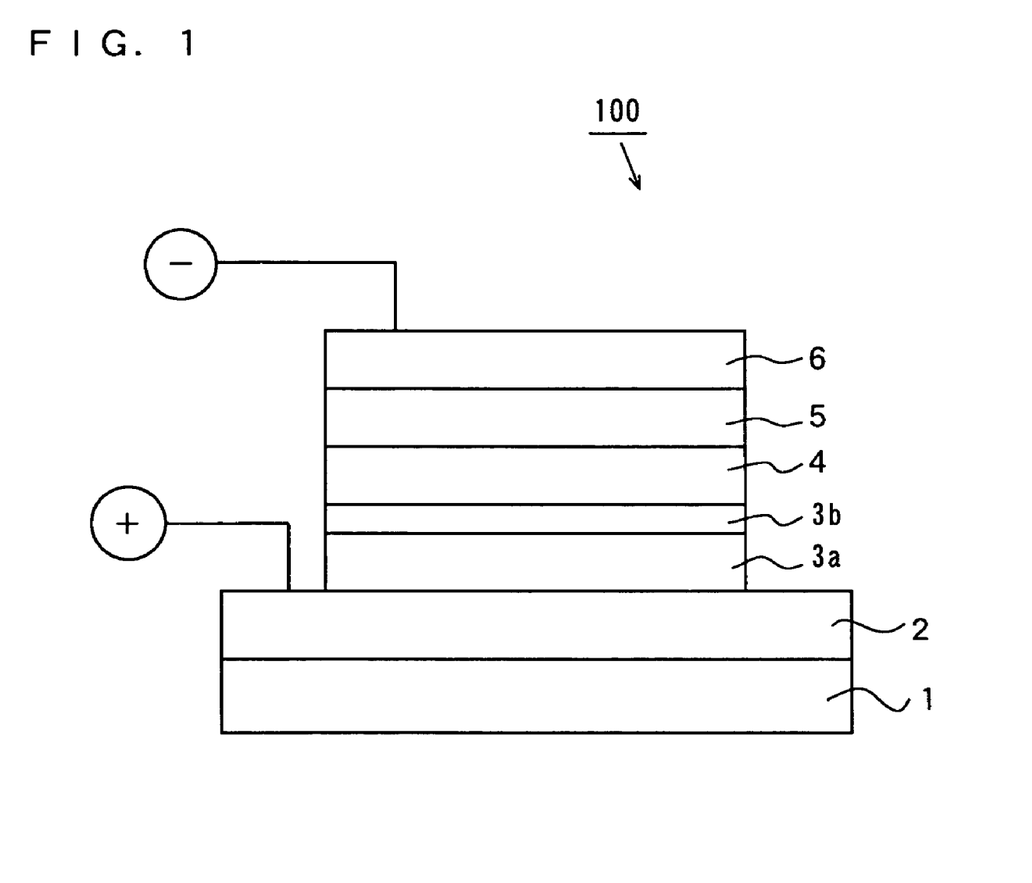
FIG. 1 is a schematic diagram showing the structure of an organic electroluminescent device having a four-layered structure according to one embodiment of the present invention.

FIG. 1 is a schematic diagram showing the structure of an organic electroluminescent device (hereinafter referred to as an organic EL device) having a four-layered structure according to one embodiment of the present invention.

As shown in FIG. 1, in an organic EL device 100, a hole injection electrode (anode) 2 made of a transparent electrode film is formed on a glass substrate 1. A hole injection layer (hereinafter referred to as a first hole injection layer) 3a made of an organic material and a hole injection layer (hereinafter referred to as a second hole injection layer) 3b formed by plasma CVD (Plasma Chemical Vapor Deposition), a hole transport layer 4 and a light emitting layer 5 each made of an organic material are formed in this order on the hole injection electrode (anode) 2. An electrode injection electrode (cathode) 6 is formed on the light emitting layer 5.

The hole injection electrode (anode) 2 is made of indium-tin oxide (ITO), for instance. The first hole injection layer 3a is made of CuPc (copper phthalocyanine). The first hole injection layer 3a made of CuPc has a function of absorbing ultraviolet light.

Figure 2:
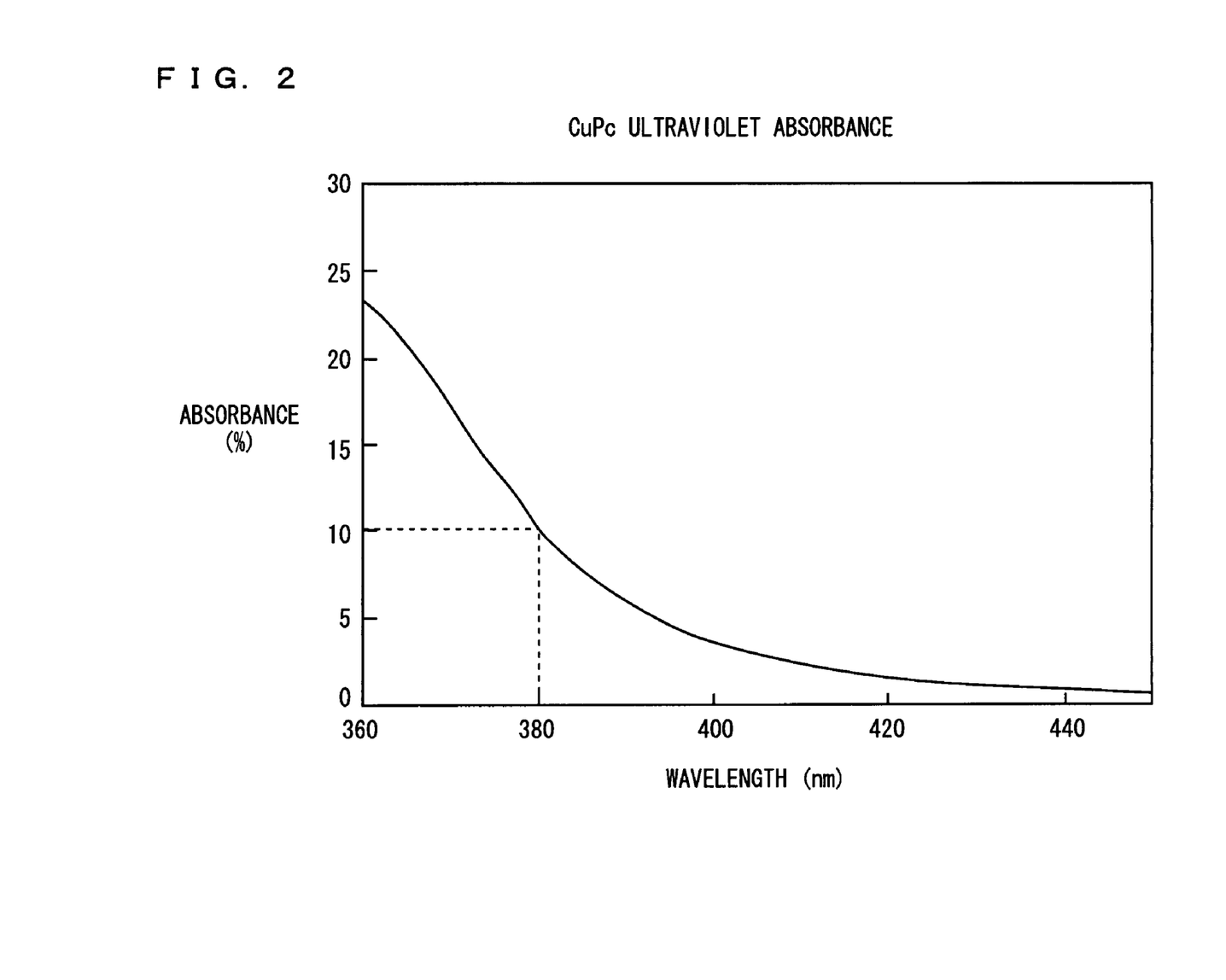
FIG. 2 is a graph showing the ultraviolet light absorbance of a first hole injection layer made of CuPc.

FIG. 2 is a diagram showing the ultraviolet light absorbance of the first hole injection layer 3a made of CuPc. In FIG. 2, the ordinate shows absorbance (%), and the abscissa shows wavelength (nm). In FIG. 2, the CuPc film thickness is 10 nm.

As indicated by the dot-line in FIG. 2, the first hole injection layer 3a made of CuPc has a property of absorbing approximately 10% or more of the ultraviolet light having a wavelength shorter than 380 nm. As a result, the CuPc serves to prevent the incidence of ultraviolet light into the second hole injection layer 3b, hole transport layer 4, and light emitting layer 5 which may cause the light deterioration of the organic EL device.

The second hole injection layer 3b is made of CFx (fluorocarbon). The hole transport layer 4 is made of N,N'-Di(naphthalene-1-yl)-N,N'-diphenyl-benzidine, for instance, which has the molecular structure expressed by the following formula (1):

(1)

The light emitting layer 5 includes, for instance, Tris(8-hydroxyquinolinato)aluminum (hereinafter referred to as Alq) which has the molecular structure expressed by the following equation (2) as a host material, and also includes tert-butyl substituted dinaphthylanthracene (hereinafter referred to as a compound A) which has the molecular structure expressed by the following formula (3) and 3,4-Difluoro-N,N'-Dimethyl-quinacridone (hereinafter referred to as a compound B) expressed by the following formula (4) as dopants.

The electrode injection electrode (cathode) 6 is made of an MgIn alloy (magnesium-indium alloy in a ratio of 10:1), for instance.

In the above-described organic EL device 100, voltage is applied between the hole injection electrode (anode) 2 and the electron injection electrode (cathode) 6, so that the light emitting layer 5 emits green light. Of the green light emitted from the light emitting layer 5, most of the visible light having a wavelength longer than 380 nm is transmitted through the first hole injection layer 3a of CuPc, and emitted from the back surface of the glass substrate 1. Meanwhile, most of the ultraviolet light having a wavelength shorter than 380 nm is absorbed by the first hole injection layer 3a of CuPc.

The hole injection layer 3b made of CFx serves to promote the injection of holes into the hole transport layer 4 and light emitting layer 5, and has a function of reducing the initial drive voltage.

In the organic EL device 100 according to the present embodiment, the first hole injection layer 3a of CuPc and the second hole injection layer 3b of CFx are formed between the hole injection electrode (anode) 2 and the hole transport layer 4, so that the light deterioration can be prevented, while the initial drive voltage can be reduced. Furthermore, increase of the drive voltage with time necessary to compensate for the lowering of luminance by the light deterioration can be suppressed.

Note that the organic EL device according to the present invention may have any of various structures other than the above-described structure. For instance, an electron injection layer or an electron transport layer may further be provided between the light emitting layer 5 and the electron injection electrode (cathode) 6.

Various types of known polymeric materials may be employed as a material for the light emitting layer 5. In that case, the provision of the hole transport layer 4 is not necessary.

Moreover, while in the above-described embodiment CuPc is employed as a material for the first hole injection layer 3a, any of various materials other than CuPc may be employed, provided that they have a function of absorbing 10% or more of the light having a wavelength shorter than 380 nm when the film is 10 nm in thickness. It is preferable to employ a material selected from the group consisting of a phthalocyanine-based material, porphyrin compound, amine-based material, polyaniline-based material, polythiophene material, and polypyrrole-based material.

In addition, while CFx is employed as a material for the second hole injection layer 3b, any of various materials other than inorganic thin films such as CFx may be employed, provided that they are capable of promoting the injection of holes and reducing the initial drive voltage. It is preferable to employ a material selected from the group consisting of a phthalocyanine-based material, porphyrin compound, amine-based material, polyaniline-based material, polythiophene material, and polypyrrole-based material.

In addition, while CFx is employed as a material for the second hole injection layer 3b, non-crystalline or crystalline inorganic materials, such as C-based, Si-based, SiC-based, and CdS-based materials may also be employed. A C-based halide or Si-based halide may also be employed as a material for the second hole injection layer 3b. Alternatively, a rare-earth fluoride containing a rare-earth element selected from the group consisting of Ce, Pr, Nd, Sm, Eu, Gd, Tb, Dy, Ho, Er, Tm, and Yb, or a transition metal fluoride containing a transition metal selected from the group consisting of Ti, V, Cr, Mn, Fe, Co, Ni, and Cu may be employed as a material for the second hole injection layer 3b.

Further, while in the above-described embodiment the hole injection electrode (anode) 2, first hole injection layer 3a, second hole injection layer 3b, and hole transport layer 4 are formed in this order, the hole injection electrode (anode) 2, second hole injection layer 3b, first hole injection layer 3a, and hole transport layer 4 may alternatively be formed in this order.

The organic EL device 100 described above may be used in combination with an organic EL device emitting orange or red light and an organic EL device emitting blue light. In this case, the use of an organic EL device emitting orange or red light as a pixel emitting red light (R pixel), an organic EL device emitting green light as a pixel emitting green light (G pixel), and an organic EL device emitting blue light as a pixel emitting blue light (B pixel) enables display of three primary colors of light (RGB display), thereby realizing a full-color display.

Moreover, the light emitting layer 5 may have a layered structure formed of two light emitting layers emitting different colors of light, respectively. For instance, when one of the two layers is doped with a luminescent dopant that provides orange or red light emission, while the other is doped with a luminescent dopant that provides blue light emission, a white light-emitting device can be obtained. In this case, the use of the white light emitting device in combination with filters of red, green, and blue enables three primary colors of light (RGB display), thereby realizing a full-color display.

In this case, it is possible that the organic EL device may be exposed to ultraviolet irradiation, in particular through the blue filter; however, by the function of the above-described organic EL device for preventing the ultraviolet light deterioration, lowering of luminance in the organic EL device can be suppressed. As a result, the white balance of red, blue and green can be maintained.

While in the above-described embodiment, the organic EL device 100 has a back emission structure in which the light produced in the light emitting layer 5 is emitted outward through the glass substrate 1, the organic EL device may alternatively have a top-emission structure in which the light produced in the light emitting layer 5 is emitted from the top through the electron injection electrode (cathode) 6.

EXAMPLES

Organic EL devices according to Inventive Example 1 and Comparative Examples 1, 2 were fabricated, and measured for their initial drive voltages and voltage increases after photoirradiation.

Inventive Example 1

The organic EL device in Inventive Example 1 was fabricated as follows. A hole injection electrode (anode) 2 made of indium-tin oxide (ITO) was formed on a glass substrate 1, and the glass substrate 1 provided with the hole injection electrode (anode) 2 was cleaned with a neutral detergent, and then subjected to ultrasonic cleaning for ten minutes in acetone and for another ten minutes in ethanol. The surface of the glass substrate 1 was subsequently cleaned by an ozone cleaner. Then, a first hole injection layer 3a made of CuPc was formed on the hole injection electrode (anode) 2 by vacuum evaporation. The first hole injection layer 3a of CuPc has the function of absorbing the ultraviolet light having a wavelength shorter than 380 nm, as mentioned above.

A second hole injection layer 3b made of CFx was then formed on the first hole injection layer 3a by plasma CVD using $CHF_3$ gas. The second hole injection layer 3b of CFx serves to promote the injection of holes, and has a function of reducing the initial drive voltage.

Note that the first injection layer 3a according to Inventive Example 1 was 10 nm in thickness, and the second injection layer 3b was 0.5 nm in thickness.

In addition, a hole transport layer 4 made of NPB with a thickness of 50 nm was formed on the second hole injection layer 3b by vacuum evaporation. A light emitting layer 5 with a thickness of 35 nm was formed on the hole transport layer 4 by vacuum evaporation. The light emitting layer 5 includes Alq as a host material, and 20% by weight of the above-described compound A and 0.7% by weight of the compound B as dopants.

An electron injection electrode (cathode) 6 made of an MgIn alloy with a thickness of 200 nm was then formed on the light emitting layer 5 by vacuum evaporation. The vacuum evaporation for each layer was performed in an atmosphere with a vacuum degree of $1\times10^{-6}$ Torr without controlling the substrate temperature. The organic EL device according to Inventive Example 1 was thus fabricated.

Comparative Example 1

The organic EL device in Comparative Example 1 was fabricated in the same way as that of Inventive Example 1 except that the second hole injection layer 3b made of CFx was not formed. The first hole injection layer 3a according to Comparative Example 1 was 10 nm in thickness.

Comparative Example 2

The organic EL device in Comparative Example 2 was fabricated in the same way as that of Inventive Example 1 except that the first hole injection layer 3a was not formed. The second hole injection layer 3b according to Comparative Example 2 was 0.5 nm in thickness.

Evaluation 1

Table 1 shows the measurement results of the initial drive voltages and voltage increases after photoirradiation in the organic EL devices in Inventive Example 1 and Comparative Examples 1, 2. Note that the drive voltages were each adjusted so that the current densities would be 20 mA/cm², and the initial drive voltages and drive voltages after photoirradiation were measured. The photoirradiation was performed by irradiating a light of 100 mW/cm² in an AirMass (hereinafter refereed to as AM) of 1.5.

TABLE 1

|  | first hole injection layer material | second hole injection layer material | initial drive voltage (V) | voltage increases after photoirradiation(V) |
|---|---|---|---|---|
| Comparative Example 1 | CuPu | — | 9.0 | 0.3 |
| Comparative Example 2 | — | CF$_x$ | 6.0 | 2.0 |
| Inventive Example 1 | CuPu | CF$_x$ | 6.1 | 0.5 |

As shown in Table 1, the initial drive voltages of the organic EL devices in Inventive Example 1 and Comparative Example 2 are reduced as compared with that of the organic EL device in the Comparative Example 1. Further, the voltage increases after irradiation of the organic EL devices in Inventive Example 1 and Comparative Example 1 are reduced as compared with that of the organic EL device in Comparative Example 2.

It can be seen, therefore, that in the organic EL device in Comparative Example 1 with only the first hole injection layer 3a made of CuPc, reduction in the initial drive voltage was not realized, while in the organic EL device in Comparative Example 2 with only the second hole injection layer 3b made of CFx, reduction in the voltage increase after photoirradiation was not realized.

On the other hand, in the organic EL device in Inventive Example 1 with the first hole injection layer 3a and second hole injection layer 3b, reductions in the initial drive voltage and voltage increase after photoirradiation were realized.

Inventive Examples 2-8

Seven types of organic EL devices in Inventive Examples 2 to 8 were fabricated by varying the thicknesses of the first hole injection layers 3a made of CuPc at 0 nm, 3 nm, 5 nm, 10 nm, 15 nm, 17 nm, and 20 nm, respectively. Note that the organic EL devices in Inventive Examples 2 to 8 were fabricated under the same conditions using the same way as in Inventive Example 1.

Figure 3:
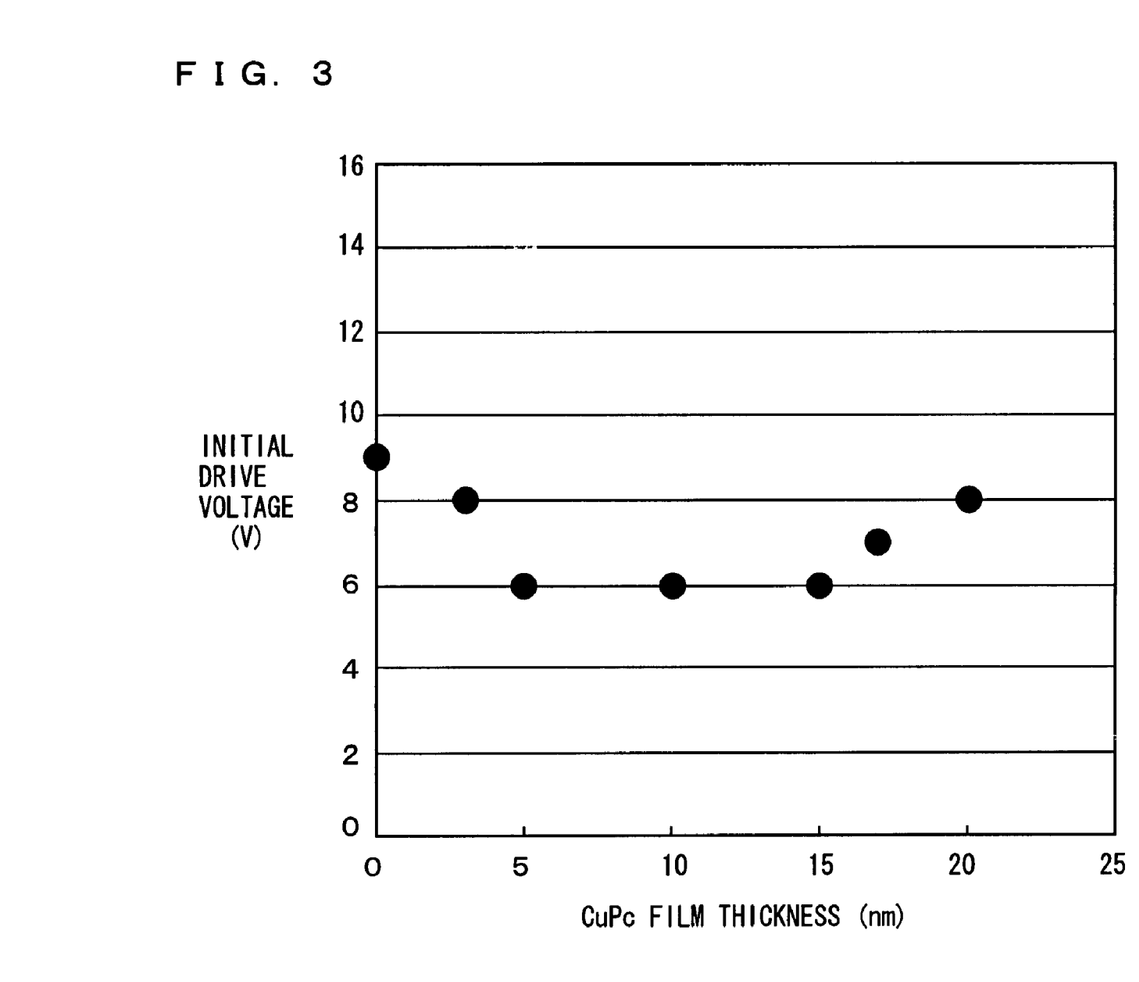
FIG. 3 is a graph showing the relationships between the thicknesses of the first hole injection layers made of CuPc and the initial drive voltages in the organic EL devices in Inventive Examples 2 to 8.
Figure 4:
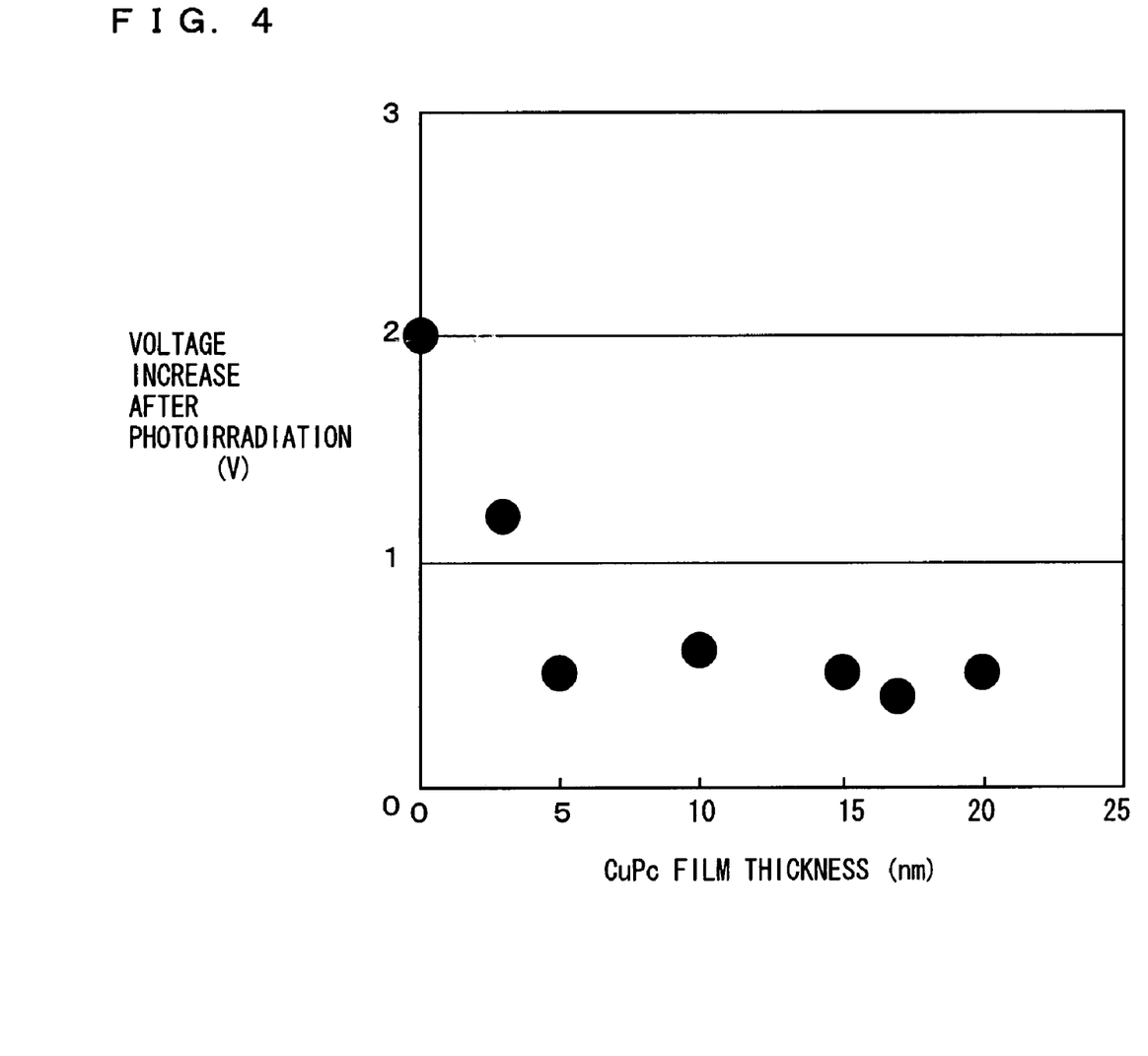
FIG. 4 is a graph showing the relationships between the thicknesses of the first hole injection layers made of CuPc and the voltage increases after photoirradiation in the organic EL devices in Inventive Examples 2 to 8.

Table 2 shows the measurement results of the initial drive voltages and voltage increases after photoirradiation in the organic EL devices in Inventive Examples 2 to 8. FIG. 3 is a graph showing the relationships between the thicknesses of the first hole injection layers 3a of CuPc and the initial drive voltages in the organic EL devices in Inventive Examples 2 to 8. FIG. 4 is a graph showing the relationships between the thicknesses of the first hole injection layers 3a of CuPc and the voltage increases after photoirradiation in the organic EL devices in Inventive Examples 2 to 8.

Note that the initial drive voltages and voltage increases after photoirradiation were measured under the same conditions as in Inventive Example 1 and Comparative Examples 1, 2.

In FIG. 3, the ordinate shows the initial drive voltage, and the abscissa shows the thickness of the first hole injection layer 3a. In FIG. 4, the ordinate shows the voltage increase after photoirradiation, and the abscissa shows the thickness of the first hole injection layer 3a.

TABLE 2

|  | CuPu film thickness (nm) | initial drive voltage (V) | voltage increases after photoirradiation(V) |
|---|---|---|---|
| Inventive Example 2 | 0 | 9 | 2 |
| Inventive Example 3 | 3 | 8 | 1.2 |
| Inventive Example 4 | 5 | 6 | 0.5 |
| Inventive Example 5 | 10 | 6 | 0.6 |
| Inventive Example 6 | 15 | 6 | 0.5 |
| Inventive Example 7 | 17 | 7 | 0.4 |
| Inventive Example 8 | 20 | 8 | 0.5 |

As shown in Table 2 and FIG. 3, the initial drive voltages are reduced when the thicknesses of the first hole injection layers 3a of CuPc are 3 nm or larger, and the initial drive voltages are further reduced when the thicknesses of the first hole injection layers 3a of CuPc are 5 nm or larger.

Moreover, the initial drive voltages are reduced when the thicknesses of the first hole injection layers 3a of CuPc are 20 nm or smaller, the initial drive voltages are further reduced when the thicknesses are 17 nm or smaller, still further reduced when the thicknesses are 15 nm or smaller.

As shown in Table 2 and FIG. 4, the voltage increases after photoirradiation are reduced when the thicknesses of the first hole injection layers 3a of CuPc are 3 nm or larger, and the voltage increases after photoirradiation are further reduced when the thicknesses of the first hole injection layers of CuPc are 5 nm or larger.

The results above show that in order to realize reductions in the initial drive voltage and voltage increase after photoirradiation, the thickness of the first hole injection layer 3a of CuPc is preferably not less than 3 nm nor more than 20 nm, more preferably not less than 5 nm nor more than 17 nm, still more preferably not less than 5 nm nor more than 15 nm.

Inventive Examples 9-16

Eight types of organic EL devices in Inventive Examples 9 to 16 were fabricated by varying the thicknesses of the second hole injection layers 3b of CFx at 0 nm, 0.5 nm, 1 nm, 2 nm, 3 nm, 5 nm, 8 nm, and 10 nm, respectively. Note that the organic EL devices in Inventive Examples 9 to 16 were fabricated under the same conditions using the same way as in Inventive Example 1 except in the thicknesses of the respective second hole injection layers 3b.

Figure 5:
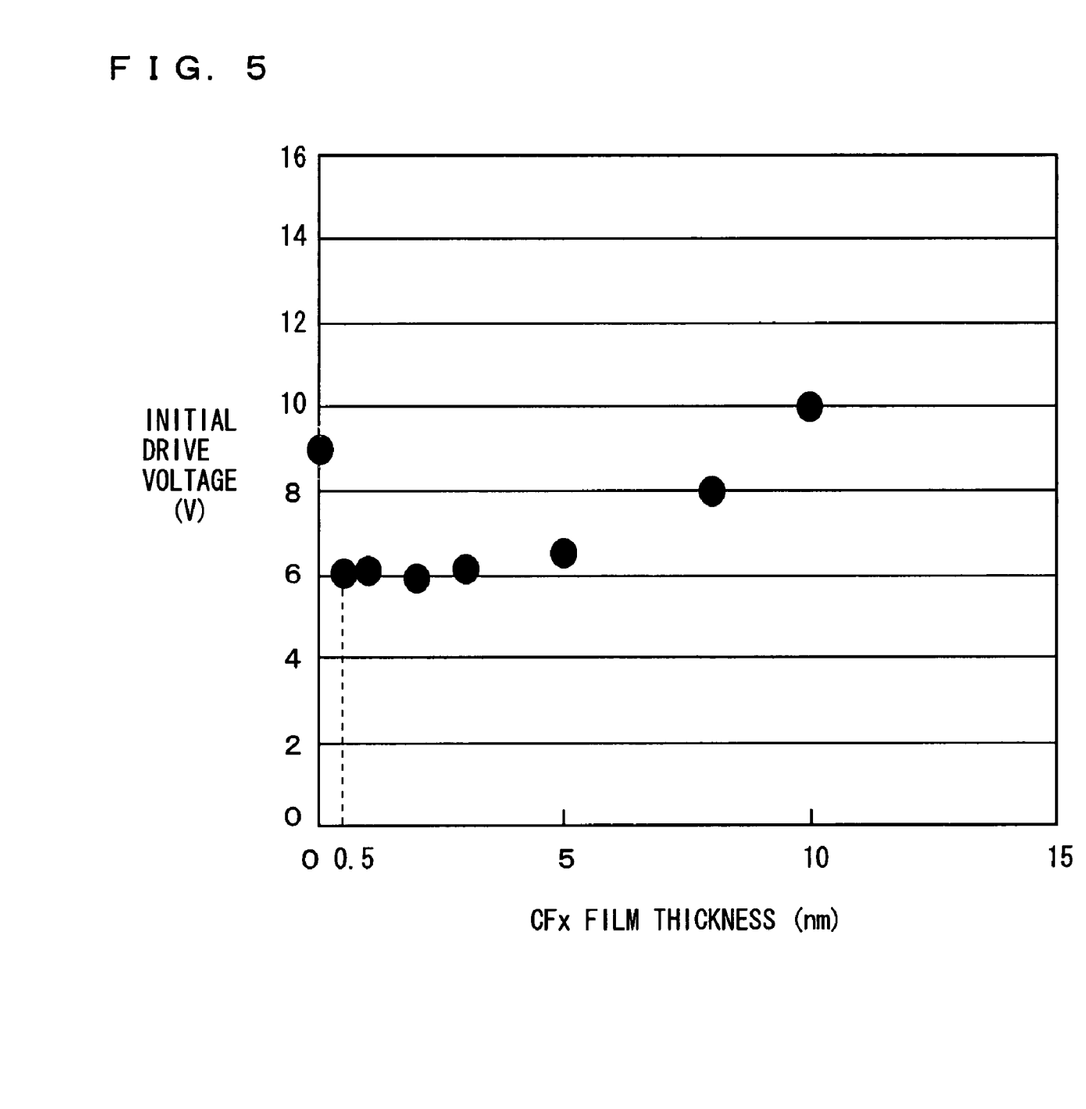
FIG. 5 is a graph showing the relationships between the thicknesses of the second hole injection layers made of CFx and the initial drive voltages in the organic EL devices in Inventive Examples 9 to 16.
Figure 6:
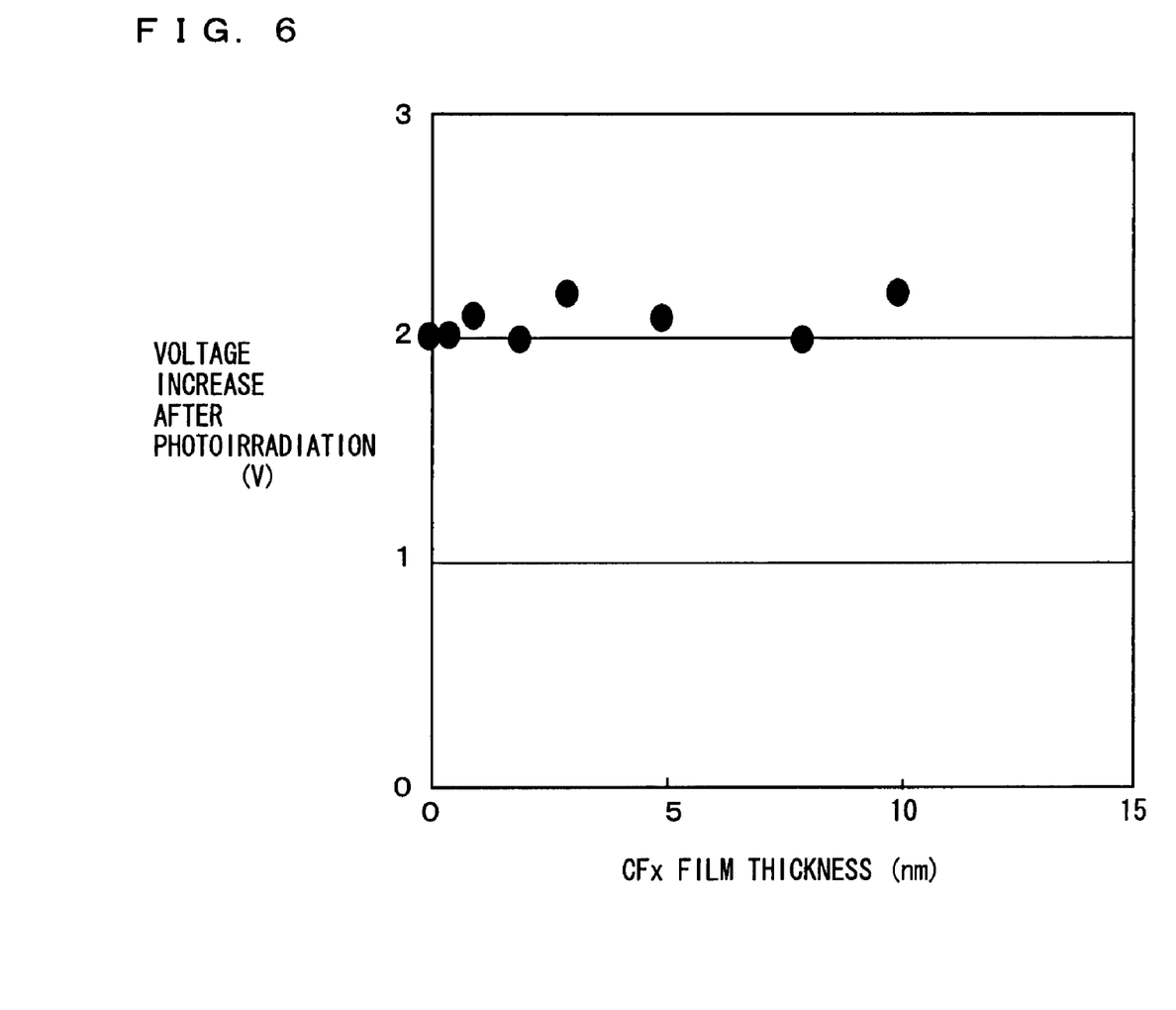
FIG. 6 is a graph showing the relationships between the thicknesses of the second hole injection layers made of CFx and the voltage increases after photoirradiation in the organic EL devices in Inventive Examples 9 to 16.

Table 3 shows the measurement results of the initial drive voltages and voltage increases after photoirradiation in the organic EL devices in Inventive Examples 9 to 16. FIG. 5 is a graph showing the relationships between the thicknesses of the second hole injection layers 3b of CFx and the initial drive voltages in the organic EL devices in Inventive Examples 9 to 16. FIG. 6 is a graph showing the relationships between the thicknesses of the second hole injection layers 3b of CFx and the voltage increases after photoirradiation in the organic EL devices in Inventive Examples 9 to 16.

Note that the initial drive voltages and voltage increases after photoirradiation were measured under the same conditions as in Inventive Example 1 and Comparative Examples 1, 2.

In FIG. 5, the ordinate shows the initial drive voltage, and the abscissa shows the thickness of the second hole injection layer 3b. In FIG. 6, the ordinate shows the voltage increase after photoirradiation and the abscissa shows the thickness of the second hole injection layer 3b.

TABLE 3

| | $CF_x$ film thickness (nm) | initial drive voltage (V) | voltage increases after photoirradiation(V) |
|---|---|---|---|
| Inventive Example 9 | 0 | 9 | 2 |
| Inventive Example 10 | 0.5 | 6 | 2 |
| Inventive Example 11 | 1 | 6.1 | 2.1 |
| Inventive Example 12 | 2 | 5.9 | 2 |
| Inventive Example 13 | 3 | 6.1 | 2.2 |
| Inventive Example 14 | 5 | 6.5 | 2.1 |
| Inventive Example 15 | 8 | 8 | 2 |
| Inventive Example 16 | 10 | 10 | 2.2 |

As shown in Table 3 and FIG. 5, the initial drive voltages are reduced when the thicknesses of the second hole injection layers 3b of CFx are 0.5 nm or larger. In addition, the initial drive voltages are reduced when the thicknesses of the second hole injection layers 3b of CFx are 8 nm or smaller, the initial drive voltages are further reduced when the thicknesses are 5 nm or smaller, still further reduced when the thicknesses are 3 nm or smaller.

Moreover, as shown in Table 3 and FIG. 6, the voltage increases after photoirradiation are sufficiently reduced when the thicknesses of the second hole injection layers 3b of CFx are not less than 0 nm nor more than 10 nm.

The results above show that in order to realize reductions in both the initial drive voltage and voltage increase after photoirradiation, the thickness of the second hole injection layer 3b of CFx is preferably not less than 0.5 nm nor more than 8 nm, more preferably not less than 0.5 nm nor more than 5 nm, still more preferably not less than 0.5 nm nor more than 3 nm.

By efficiently reducing the initial drive voltage and the voltage increase after photoirradiation as described above, reduction in the total amount of the drive voltage of an organic EL device was achieved. In other words, it is possible to lower the initial drive voltage while eliminating the need to increase the drive voltage necessary to compensate for the lowering of luminance by the light deterioration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An organic electroluminescent device comprising in the following order:
   a hole injection electrode;
   a first hole injection layer formed directly on the hole injection electrode having a property of absorbing ultraviolet light and including a copper phthalocyanine;
   a second hole injection layer including a fluorocarbon formed directly on the first hole injection layer;
   a light emitting layer; and
   an electron injection electrode formed on the light emitting layer.

2. The organic electroluminescent device according to claim 1, wherein
   said first hole injection layer absorbs not less than 10% of ultraviolet light having a wavelength shorter than 380 nm.

3. The organic electroluminescent device according to claim 1, wherein
   said first hole injection layer has a thickness not smaller than 5 nm.

4. The organic electroluminescent device according to claim 1, wherein
   said first hole injection layer has a thickness not larger than 15 nm.

5. The organic electroluminescent device according to claim 1, wherein
   said second hole injection layer has a thickness not smaller than 0.5 nm.

6. The organic electroluminescent device according to claim 1, wherein
   said second hole injection layer has a thickness not larger than 3 nm.

7. A method of manufacturing an organic electroluminescent device comprising the steps of:
   forming a hole injection electrode;
   forming a first hole injection layer directly on the hole injection electrode, the first hole injection layer including a copper phthalocyanine and having a property of absorbing ultraviolet light;
   forming a second hole injection layer directly on the first hole injection layer by plasma chemical vapor deposition, the second hole injection layer including a fluorocarbon;
   forming a light emitting layer above the second hole injection layer; and
   forming an electron injection electrode on the light emitting layer.

* * * * *